US006849299B2

(12) United States Patent
Corderman et al.

(10) Patent No.: US 6,849,299 B2
(45) Date of Patent: Feb. 1, 2005

(54) APPARATUS AND METHOD FOR INTRODUCING SMALL AMOUNTS OF REFRACTORY ELEMENTS INTO A VAPOR DEPOSITION COATING

(75) Inventors: Reed Roeder Corderman, Niskayuna, NY (US); Melvin Robert Jackson, Niskayuna, NY (US); Richard Arthur Nardi, Jr., Scotia, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/272,256

(22) Filed: Oct. 16, 2002

(65) Prior Publication Data

US 2003/0047139 A1 Mar. 13, 2003

Related U.S. Application Data

(62) Division of application No. 09/684,425, filed on Oct. 10, 2000, now abandoned.

(51) Int. Cl.[7] .............................................. C23C 14/30
(52) U.S. Cl. ............. 427/250; 427/249.18; 427/249.19; 427/255.23; 427/566; 427/596
(58) Field of Search ................................. 427/566, 596, 427/250, 249.18, 249.19, 255.23

(56) References Cited

U.S. PATENT DOCUMENTS

| | | | | |
|---|---|---|---|---|
| 3,730,962 A | * | 5/1973 | Norwalk .......................... | 13/31 |
| 4,748,935 A | * | 6/1988 | Wegmann ..................... | 118/723 |
| 5,296,274 A | * | 3/1994 | Movchan et al. ............ | 427/566 |
| 5,474,809 A | * | 12/1995 | Skelly et al. ................. | 427/250 |
| 5,698,273 A | * | 12/1997 | Azad et al. ................... | 427/566 |
| 5,773,078 A | | 6/1998 | Skelly | |
| 6,145,470 A | * | 11/2000 | Bruce et al. ........... | 118/723 AB |
| 6,174,571 B1 | * | 1/2001 | Corderman et al. ......... | 427/585 |

FOREIGN PATENT DOCUMENTS

| | | |
|---|---|---|
| EP | 0 799 904 | 10/1997 |
| EP | 0 969 115 | 1/2000 |
| EP | 799904 B1 * | 9/2000 |
| JP | 10096077 | 4/1998 |

OTHER PUBLICATIONS

GE Carver and EE Chain, "CVD Molybdenum Films of High Infrared Reflectance and Significant Solar Absorptance", Journal De Physique, Collique C1, supplement au nol, tome 42, janvier 1981, pp. C1–203–C1–211.

(List continued on next page.)

Primary Examiner—Timothy Meeks
(74) Attorney, Agent, or Firm—Robert P. Santandrea; Patrick K. Patnode

(57) ABSTRACT

A method of introducing small amounts of a refractory element into a vapor deposition coating. A second material (30), containing at least two elements which are desired to be deposited as a coating on a base material, has placed over it a first material (20) substantially comprising such two elements and a refractory element. The first material (20) is adapted to permit transport of the at least two elements in the second material (30) through the first material (20) when the first (20) and second (30) material are in a molten state and in touching contact with the other so as to permit evaporation of the two elements and the refractory element from an exposed surface. Heat is supplied to the first (20) and second (30) materials to permit evaporation of the at least two elements of second material (30) and the refractory element in the first material (20), and the resulting vapors are condensed as a deposit on a base material (50). A particular method of heating is further disclosed to assist in maintaining adequate rates of evaporation for the aforesaid method, wherein the supplied heat is supplied to an inner heated area (91) and a surrounding outer heated area (92) and at least a portion of the inner heated area (91) is heated to a greater temperature than the outer heated area (92).

6 Claims, 3 Drawing Sheets

OTHER PUBLICATIONS

GE Carver, "Chemically Vapor Deposited Molybdenum Films of High Infrared Reflectance", thin Solid Films, 63 (1979) pp. 169–174.

GE Carver, DD Allred and BO Seraphin, "Chemical Vapor Deposited Molybdenum Films for Use in Photothermal Conversion", SPIE vol. 161, Optics Applied to Solar Energy IV (1978), pp. 66–71.

GE Carver and BO Seraphin, "Chemical Vapor Deposited Molybdenum Films of High Infrared Reflectance", Appl. Phys. Lett. 34(4), Feb. 15, 1979, pp. 279–281.

EE Chain, KA Gesheva and BO Seraphin, "Chemical Vapor Deposited Molybdenum Films of High IR Reflectance and Significant Solar Absorptance", Thin Solid Films, 83 (1981) pp. 387–392.

European Search Report dated Nov. 10, 2003.

* cited by examiner

APPARATUS AND METHOD FOR INTRODUCING SMALL AMOUNTS OF REFRACTORY ELEMENTS INTO A VAPOR DEPOSITION COATING

This application is a division of application Ser. No. 09/684,425, filed Oct. 10, 2000, now abandoned.

BACKGROUND OF THE INVENTION

The present invention relates to a vapor deposition apparatus and method for applying a coating to a base material, and more particularly to a vapor deposition apparatus and method wherein small amounts of refractory elements are incorporated into a vapor deposition coating.

The thermal evaporation and condensation of solid materials such as metals to form a coating on a base material, commonly referred to as vapor deposition, is a relatively developed art. There are many sophisticated prior art techniques and apparatuses which permit such materials to be evaporated from a source and condensed to form a coating or layer on a substrate disposed a distance from the source. Such processes all involve heating a material to be evaporated to a temperature at which it has a significant vapor pressure, thus creating a vapor stream. Heating techniques include direct methods, such as heating the material to be deposited using resistance, induction, electron beam or laser beam means to melt all or some portion of the material to be evaporated, or indirectly, such as by heating the surface of a higher melting material and flashing the material to be evaporated off the hot surface. The evaporated material thereafter becomes condensed on the surface of the base material, thereby providing a coating thereon.

Refractory materials are often desired to be incorporated into coatings applied to the surface of components exposed to high temperatures, such as gas turbine components used inter alia in aircraft engines, to act as a protective coating in a process known as thermal barrier coating (TBC). Methods for depositing ceramic barrier coatings like zirconia (i.e. zirconium oxide) which serve as thermal barrier coatings are known in the art. For example, U.S. Pat. No. 5,773,078 to Skelly, commonly assigned to the assignee of the present invention, namely General Electric Company, discloses an improved method for depositing zirconium oxide from a zirconium oxide source onto a base material by means of physical vapor deposition, comprising the step of adding zirconium metal to a zirconium oxide ingot as the ingot is heated. Despite the improvements realized by the method of U.S. Pat. No. 5,773,078, use of a rare earth metal oxide such as zirconium oxide as an evaporant source causes problems due to release of the oxygen present in the oxide and difficulties in regulating the uniformity of composition in the resulting deposited condensate.

Where the starting material to be evaporated and applied as a coating to a base material is a multi-constituent alloy, other problems are encountered. In particular, the composition of the coated material when applied by the vapor deposition method as described frequently and undesirably was substantially different than the composition of the starting material, and/or the condensate would not have a uniform composition through its thickness which closely resembled that of the starting material. These problems were directly due to the fact that the rates of evaporation of elements contained in the multi-constituent starting material alloy are related to their vapor pressures at the temperature of the evaporation source. In the case of alloys, particularly multi-constituent alloys, one or two elements thereof typically have significantly higher vapor pressures than the others, such that the condensate is richer than the starting material in these elements. If the material being evaporated has a fixed volume and is entirely evaporated, the condensate will have a non-uniform composition throughout its thickness, but will reflect, in a macroscopic sense, the starting composition of the material. If the starting material is continually replenished, such as by maintaining a constant pool volume, the composition of the condensate will be higher throughout its thickness in the elements which have higher vapor pressures.

U.S. Pat. No. 5,474,809 to Skelly et al, assigned to General Electric Company who is the common assignee with respect to the present invention, expressly recognized the problems of the prior art in achieving uniform and desired composition for the coating closely corresponding to that of the evaporated material. Such patent disclosed a method for carrying out vapor deposition that achieved a coating on a base material which closely resembled the composition of the starting (i.e. evaporated) material, that is to say the coating purportedly to contain substantially the same elements in substantially the same proportions as the starting material, even if the starting material was a multi-constituent alloy having elements each of significantly different vapor pressures. In particular, the aforementioned Skelly et al patent disclosed a method of making an evaporated deposit of a material using the vapor deposition process, wherein one material (a second material) having a composition which was desired to be formed as a coating on a base material, is overlaid by a first material which consisted of a refractory material with a higher melting point or a vapor pressure at an elevated temperature that is less than each of the constituents of the second material. Accordingly, upon heating of the first material the underlying second material becomes melted, and the constituent elements of the second material proximate the overlying first material are transported by convection and thermal mixing through the first overlying material and thereafter evaporated from the surface of the first overlying material. In such process the first material becomes molten and transmits heat downwardly to the underlying second material, thereby forming a molten zone therein, and second material in such molten zone therein becomes mixed with the molten zone of first material immediately above it, permitting the second material to be evaporated from the surface thereof. Advantageously, such process purportedly permits coatings to be formed on a base material having a composition which is substantially identical to that of the second material. The second material (or at least certain of the elements therein) which were desired to be evaporated possessed vapor pressures which permitted such elements to be preferentially evaporated in comparison to the first material. Accordingly the deposit contained quantities of the second material, but no or only minute trace amounts of the first material (less than 0.05 atomic percent).

In the case of refractory materials in the form of rare earth materials such as zirconium or hafnium intended to be incorporated into a thermal coating for deposit on a base material, it is actually desirable for such materials to be evaporated and thereby incorporated in the deposited coating where a thermal barrier coating is desired to be applied. However, when rare earth metals, such as zirconium or hafnium are used in the process of Skelly et al described in U.S. Pat. No. 5,474,809 as the first material, and metal alloys such as a nickel-aluminum alloy is used as the second material, it is found that the method taught by Skelly et al is physically unworkable. In this regard, when employing a rare earth metal, such as zirconium, as the first material using the method taught by Skelly et al, such first material when melted tends to "ball-up" when heated by a heat source such as an electron beam, by virtue of the surface tension forces existing between molten zirconium and the solid second material. As a result there is little or no proper transfer of heat downwardly to the underlying second material to form a molten zone there within so as to permit molten second material to migrate upwardly there through and thereafter evaporate from the surface. In such circumstances, neither the underlying second material or the zirconium which comprises the first material becomes evaporated so as to form a deposit. Moreover, in Skelly et al even where the first material is not a rare earth metal, the Skelly et al patent did not develop or disclose any circumstances in which it was capable of obtaining quantities of the refractory metal in the deposit in concentrations greater than trace amounts (i.e. greater than 0.05 atomic percent).

BRIEF SUMMARY OF THE INVENTION

A workable vapor deposition apparatus and method for incorporating greater than trace amounts of refractory materials such as zirconium and hafnium metals into coatings on base materials for use as thermal barrier coatings and the like is disclosed and claimed.

The present invention in one of its broad embodiments consists of a method of forming a deposit on a base material, such deposit having at least two elements from a second material and small amounts of a refractory element selected from the group of refractory elements comprising zirconium, hafnium, yttrium, titanium, rhenium, silicon, chromium and alloys thereof, comprising the steps of:

selecting a first material comprising said at least two elements further alloyed with said refractory element, said second material comprising said at least two elements, said first material adapted to permit transport of said at least two elements in said second material through said first material when said first and second material are in a molten state and in touching contact with one another so as to permit evaporation of said two elements and said refractory element from an exposed surface thereof;

placing a quantity of said first material over a quantity of said second material in a crucible means so that the first material at least partially covers the second material;

supplying heat to the first material sufficient to create a molten zone within and through the first material such that the molten zone of the first material is in touching contact with the second material to thereby create a molten zone within the second material, wherein said two elements in the second material are transported through the molten zone rich in the first material and said refractory element and said two elements are each evaporated therefrom thereby forming a vapor stream; and collecting condensate from the vapor stream as a deposit on the base metal.

The method of the present invention, where the first material comprises a refractory material having a high melting temperature such as titanium, zirconium, or hafnium or alloys thereof, has the unexpected and surprising result that, contrary to what would be expected from the teachings of Skelly (if such could be practiced without the "balling up" of the rare earth metal, discussed supra) more than trace amounts, namely small amounts and amounts over 0.05 atomic percent of the refractory element may be incorporated into the deposit. In particular, and advantageously, the method of the present invention by providing a refractory element that is alloyed with at least two of the same elements that are intended to be evaporated and form part of the deposit, and further by ensuring that sufficient amounts of refractory element is present in the first material, is able to overcome not only the "balling up" difficulties of refractory rare earth metals, but further, in contrast with the result obtained by the method disclosed in U.S. Pat. No. 5,474,809 to Skelly et al, obtain a deposit having greater than simply trace amounts of a refractory material. For the purposes of this document, the definition of trace amounts is the same as adopted in the Skelly et al patent, namely atomic percentages equal to or less than 0.05 atomic percent.

In practicing the method of the present invention, it is necessary that sufficient quantities of the refractory material be present in the first material in order to produce a deposit containing more than trace amounts of refractory material (i.e. more than about 0.05 atomic percent.) It has been found at least from experimental results to date that the atomic percentages of refractory material present in the first material is not particularly directly related to the amount of refractory material present in the deposit, at least for the range of atomic percentages tested, namely the range of 33%–76% (a/o) of refractory element present in such first material, these ranges being the preferred ranges. Rather, the presence of refractory material in atomic percent in the deposited coating appears more related to the physical quantity of refractory material in the first material in proportion to the underlying second material. In other words, there is some indication from the experimental results, while not always holding true, that the greater the physical quantity of refractory material and thus the greater the quantity first material physically covering the second material when enclosed in a crucible, the greater the quantity of the refractory element present in the deposit. However, because this generalization does not appear to always hold true, some experimentation as to the amount of refractory material present in the first material for a given coverage of the second material of a given dimension may be required in order to arrive at a physical amount of refractory material which need be present in the first material in order that the deposit contain greater than trace amounts of such refractory material.

It has been found it is beneficial (although not a requirement) that the first material contain the same two elements in the same relative atomic percentages as in the second material, in order to assist in uniformity of composition of the deposited coating and also to permit the coating composition to more closely match that of the second material. Accordingly, in a first preferred embodiment, the two elements present in the second material (which in the preferred embodiment are nickel and aluminum) are present in approximately equal ratios to each other. Likewise in another preferred embodiment, the two elements present in the first material are also present therein in approximately equal ratios. Preferably, as mentioned above, the two elements present in both the first material and the second material are present in equal ratios in each of the first and second materials, with such ratio being approximately 50—50 (a/o) in the preferred embodiment.

The refractory material is preferably comprised of either zirconium, hafnium, yttrium, rhenium, silicon, chromium, titanium or alloys thereof, although other refractory materials or alloys thereof may be used. Where the deposited coating applied by the above method is intended to be a thermal barrier bond coating, in a preferred embodiment the first material is formed of a rare earth metal such as zirconium or hafnium. Two elements found suitable for these purposes and for alloying thereto in the first material and being present in the second material are nickel and aluminum, and in a further preferred embodiment, the nickel and aluminum exist in alloy in the second material and also in the first material in an approximate molar ratio of 1:1.

Advantageously, using the aforesaid preferred method of the present invention, refractory material may be uniformly deposited on a base material in concentrations exceeding nominal percentages (i.e. exceeding 0.05 atomic percent).

As a further consideration, it has been found that when pure rare earth metals, such as zirconium and hafnium are used as the refractory element, upon being heated have a tendency to form oxide skins. These oxide skins not only have higher melting points than the pure rare earth metals but also further tend to reduce the rate of evaporation of such rare earth metal thus slowing the rate of deposition of any condensate. These oxide skins, due to the higher melting points, greatly reduce the evaporation of rare earth metals, with the result that any deposits formed are virtually devoid of rare earth elements therein.

Accordingly, in a further aspect of the method of the present invention where the refractory element is a rare earth metal, a particular manner of heating is disclosed in order to obtain a deposit with more than simply trace concentration of rare earth metals. In particular, when carrying out the step of supplying heat to said first material, such step comprises supplying heat to an inner heated area and a surrounding outer heated area, wherein at least a portion of said inner heated area is heated to a greater temperature than the surrounding outer heated area. In a preferred embodiment, where an electron beam is used as a means of heating, such heating step comprises directing an electron beam across the first material, further comprising:

directing such a beam across the inner heated area; and directing such a beam across the outer heated area; and providing a scanning pattern effective to transiently increase temperature of a least a portion of said inner heated area above that of said outer heated area so as to transiently increase vaporization from said at least a portion of said inner heated area.

The mechanics of how a heating pattern such as that disclosed herein is able to increase the rate of evaporation is not entirely known. It is theorized that by heating the inner heated area to a temperature greater than the surrounding outer area, that convection currents, in particular Maragoni flow patterns, are created in the molten zone, which divert oxide layers which may form at the upper exposed surface to the outer edges of the molten zone surface, thereby leaving unoxidized molten material, including rare earth metal, proximate the inner heated zone surface which can then be better evaporated from the hottest part of the molten material and thereafter condensed on the base material to thereby form the coating.

A base material or article having a coating deposited thereon by the method of the present invention is also disclosed. Advantageously, coatings applied to articles by the method of the present invention possess refractive material therein in excess of nominal percentages.

BRIEF DESCRIPTION OF THE DRAWINGS

The method and apparatus by which the method of the present invention may be practiced will now be described with reference to the accompanying drawings showing preferred (non-limiting) embodiments, in which.

DETAILED DESCRIPTION OF THE INVENTION

The method of this invention may be practiced in conventional apparatuses of the type that are commonly used for thermal or electron beam evaporation processes.

Figure 1:
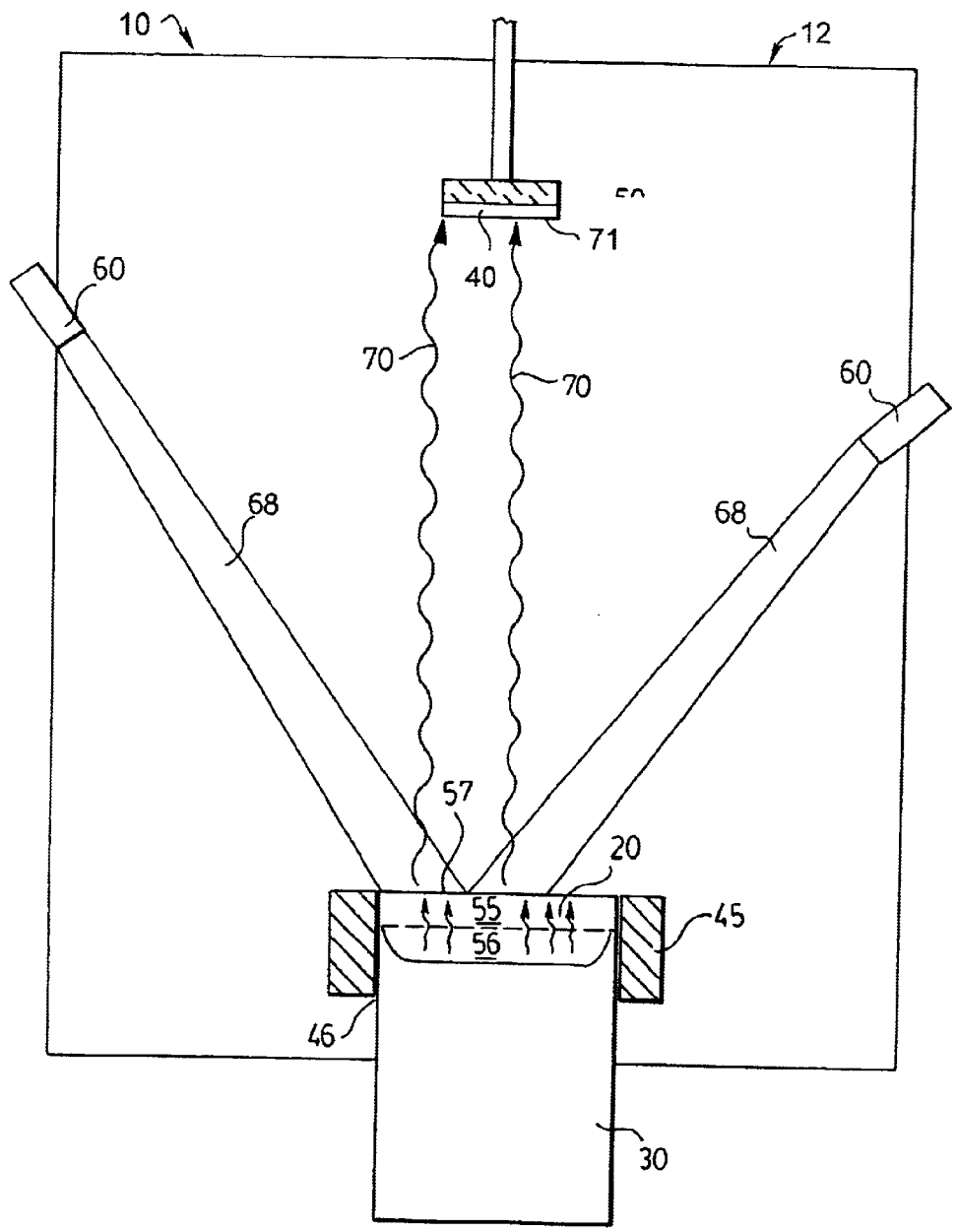
FIG. 1 is a schematic diagram of a preferred apparatus used for performing the method of this invention.
Figure 2:
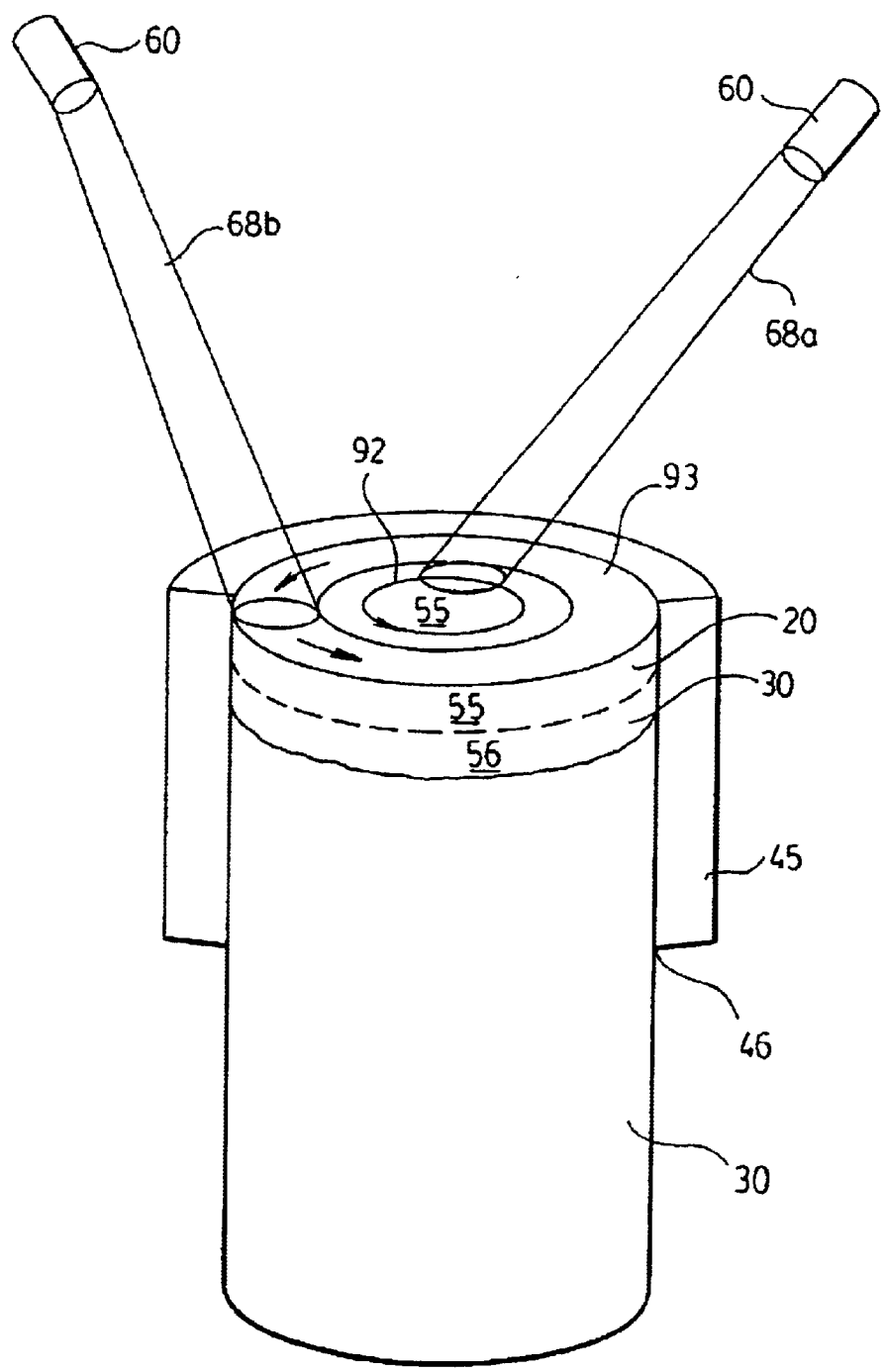
FIG. 2 is a "cut-away" illustration of a crucible containing the second material and an overlying first material "hot top" comprising the refractive material which is desired to be coated on a base material.

FIGS. 1 & 2 show an apparatus 10 for forming a condensed deposit 40 on a base material 50 using vapor deposition method of the present invention, where such deposit 40 contains small amounts of a refractory element. The apparatus 10 is used for applying a coating 71 to a base material, for such uses as thermal barrier coatings and/or anti-corrosive coatings, and the like, wherein the coating contains small amounts of a refractory element, such as zirconium, hafnium, rhenium, silicon, yttrium or other rare earth metals, or titanium, or chromium.

An airtight housing enclosure 12 is provided which may be evacuated of air, so as to permit the vapor deposition process to proceed in absence of potential contaminants and/or potential undesirable reactants. In this regard, a combination of staged mechanical, cryogenic, turbomolecular, and/or diffusion pumps may be used for the purposes of evacuating the housing enclosure 12. A crucible means 45 is situated within housing enclosure 12. For the evaporation of metal alloys through a molten pool 56, a water-cooled copper crucible of a type well known in the art is preferred. The crucible means 45 is used to contain the materials to be evaporated during the evaporation process. Such crucible means 45 may have a bore 46 which permits second material 30 in the form of a solid bar or ingot to be fed continuously or semi-continuously therethrough into crucible means 45. The ingot feed rate can be controlled so as to keep the molten pool surface 57 at a constant level, which may be desired where it is necessary to continuously maintain deposition of substrate deposit 40 at fixed vertical distances above the molten surface 57.

Heating means, which in the preferred embodiment of the invention comprise one or more electron beam guns 60, are provided for supplying heat necessary to liquefy at least a first material 20 and a portion of an underlying second material 30 which is present within the crucible means 45. Such electron beam guns 60, are well known in the art, cause evaporation of at least certain elements on the molten metal surface 57 within crucible means 45 to thereby form a vapor stream 70. The electron beam guns 60 may be provided with various automatic control patterns to adjust the energy supplied to the material, or to the effect a specific scanning/heating pattern, and in the preferred embodiment are provided with such automated control mechanisms to provide a particular heating pattern as hereinafter described to assist in maintaining a desired rate of material deposition on base material 50.

The method of the invention for forming a deposit 40 on a base material 50 will now be described. A first material 20 is selected, comprising a refractory element selected from the group of refractory elements comprising zirconium, hafnium, yttrium, titanium, rhenium, silicon, and chromium, which is alloyed with at least two additional elements. In the preferred embodiment such at least two elements are nickel and aluminum which form the major components of a nickel-based alloy, which is desired to be deposited along with a refractory element on a base material 40. However, other two (or more) predominant element combinations found in other alloys, such as Ti-base, Fe-base, and Al-base alloys, may also be used where the predominant elements of such alloys, along with a refractory element, are desired to be deposited as a coating 71 where such predominant elements are deposited in substantially the same ratios as exist in the alloy so as to result in a coating 71 having substantially the same elemental composition in approximately the same molar ratios as the material being evaporated, save and except for the further addition of small amounts of a refractory element.

A second material 30 is likewise selected, which also comprises the same two elements, such two elements intended to be evaporated and ultimately form the bulk of the deposit 40 which forms a coating 42 on base material 50. By selecting a first material 30 wherein the same two elements that are present in the second material 30 are also present in the first material 20 along with the refractory material, the applicants have found that two important advantages are realized. Firstly, where the refractory elements is a rare earth such as zirconium, the alloying of zirconium with such at least two elements overcomes the "balling up" problem if simply a pure refractory element, namely a rare earth metal such as zirconium, were used as the first material 20. Such alloying thereby permits the first material 20, upon being heated, to liquefy and advantageously spread over the second material 30, as shown in FIG. 1, rather than becoming "balled up". In such manner the molten alloy mixture is thereby able to transmit heat downwardly so as to cause a molten zone 56 to appear in second material 30, and allow the method of the present invention to be performed and result in a deposit having such refractory material therein. Secondly, by including the same two elements in the first material 20 as those which are (principally) contained in the second material 30, more uniform deposits and deposits having compositions more closely resembling the original starting material (i.e. second material 30) which is desired to be deposited are able to be obtained.

Once the first material 20 and second material 30 are selected, a quality of second material 30 is placed in crucible means 45. Thereafter, a quantity of the first material 30 is placed over the quantity of the second material 30 in the crucible means 45 so that the first material at least partially covers the second material 30. Thereafter, a base material 50 is situated in a vertically disposed position immediately above the crucible means 45, and the housing enclosure 12 evacuated of air. Heat is then supplied to the first material 20 sufficient to create a molten zone 55 within and through the first material 20 such that the molten zone 55 of the first material 20 is in touching contact with the second material 30 to thereby likewise create a molten zone 56 within the second material 30, wherein the at least the two elements in the second material are transported through the molten zone 55 rich in the first material 20, and the refractory element and the two elements are each evaporated therefrom forming a vapor stream 70. Such vapor stream 70 is condensed on base material 50 to form deposit 40 thereon. After a period of time such deposit 40 forms a coating 71 containing the at least two elements from the second material and the refractory element from the first material 20.

The heating of the first and second material 20, 30 respectively in the crucible means 45 may be accomplished by suitable heating means, including known means such as resistance heaters, induction heating coils and electron beam guns. In the case of high temperature first materials 20, and in particular where rare earth metals such as zirconium are used as the refractory element in the first material, an electron beam gun or guns 60 are preferred as the heating means. Using electron beam guns 60 one or more electron beams 68 can be rastered over the surface 57 of the first and second material 20, 30 in a variety of patterns which can assist mixing of the molten materials, and has the additional added advantages (such as in the case of heating of rare earth metals where oxide layers may tend to form) in creating Maragani flow patterns (see FIG. 4) within the molten zone 55 and 56 which assist in maintaining and preventing a decrease in the rate of refractory element evaporation from surface 57.

With respect to preferential rastering patterns, the applicants have found that a specific rastering pattern advantageously, particularly where the refractory element is a rare earth metal such as zirconium prone to oxide layer formation, maintains continuous deposition rates and thus assists in obtaining commercially viable rates of deposition of a coating 71 on a base material 50. In this regard, the applicants have found that a heating method useful in combination with the method of the present invention, wherein heat is supplied to an inner area 91 and a surrounding outer heated area 92 wherein at least a portion of the inner heated area 91 is heated to a greater temperature than the outer heated area 93, is advantageous in maintaining commercially viable deposition rates.

Figure 3:
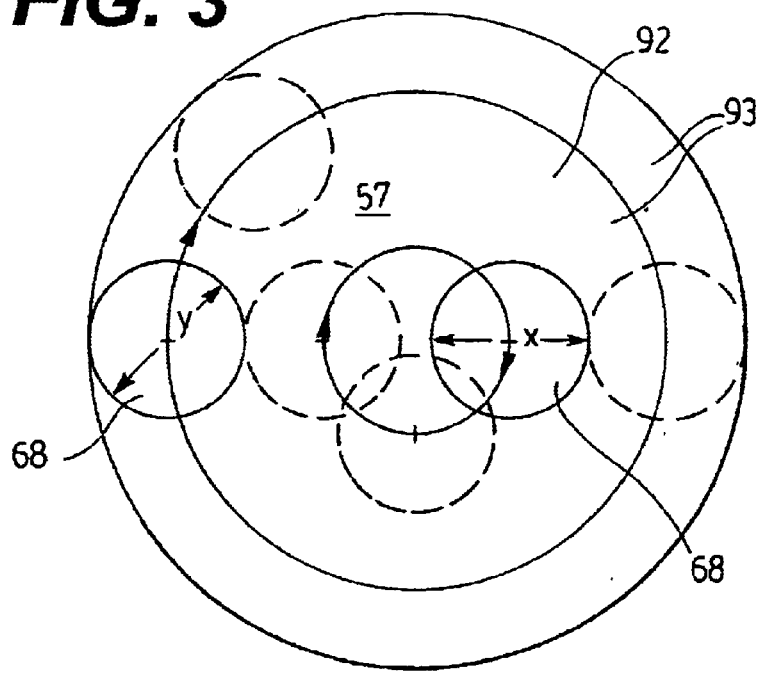
FIG. 3 is an illustration of a preferred electron beam scanning pattern for use where the refractory material is a rare earth metal.
Figure 4:
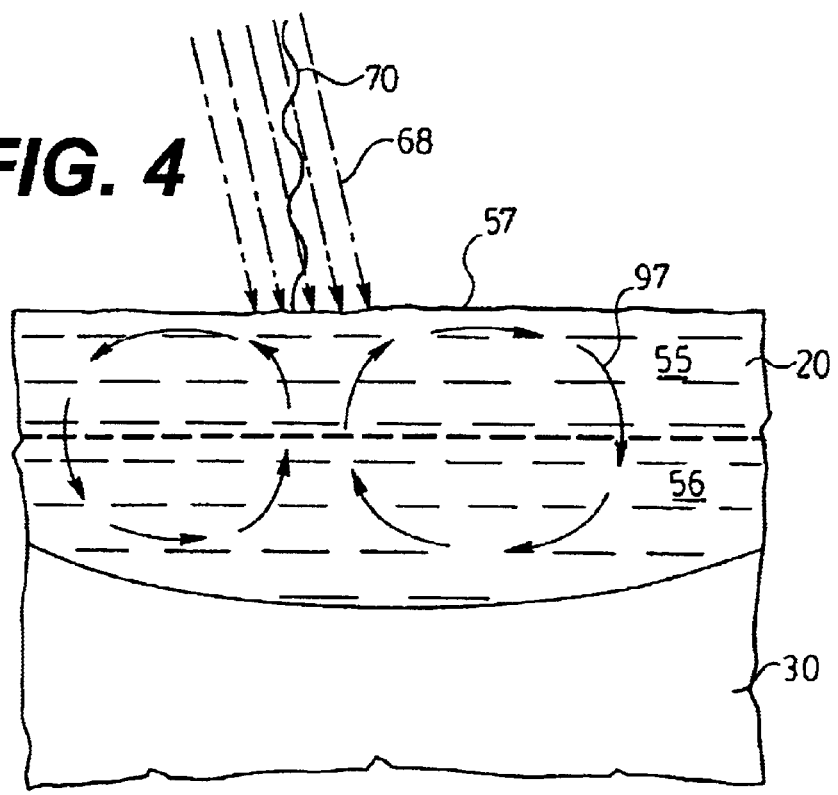
FIG. 4 is a schematic view of a cross section through the molten zones in the crucible means during heating of the material therein using a particular heating pattern.

With respect to this particular heating pattern, reference is to be had to FIGS. 2–4 inclusive. In particular, in a preferred embodiment of this invention, an electron beam gun 60 and electron beam 68 are used to accomplish such heating pattern, wherein the electron beam or beams 68 from the electron beam gun(s) 60 are directed across both an inner heated area 92 and an outer heated area 93, and the scanning pattern of such electron beam or beams 68 is such to transiently increase the temperature of at least a portion of an inner heated area 92 above that of the outer heated area 93 so as to transiently increase vaporization from the portion of inner heated area 92. (See FIGS. 2 & 3).

In the preferred embodiment, circular electron beams 68 are used, which may be provided from a single electron beam gun 60 or two or more guns 60. In the preferred embodiment a single beam 68 from beam gun 60 provides a circular beam 68a of diameter 'a', and is moved in a circular pattern so as to heat an inner circular area 92 of diameter '2x'. (See FIG. 3) Likewise, a second electron beam gun 60 is provided to provide a circular beam 68b, of diameter 'y', which is likewise moved in a circular motion to heat a circular area 93. The two electron beams guns 60 are cycled so that beam 68a temporarily, due to either higher beam power or more frequent cycling times, transiently increases the temperature of a portion or all of inner heated area 92 over outer heated area 93. It is accordingly believed that such heating pattern transiently increases the vaporization from the inner heated area 92 over the outer heated area 93, so as to create Marangoni flow patterns 97 within the molten zones 55 and 56 of the first and second materials 20, 30, thereby increasing mixing between the two zones, 55 and 56 and further causing any oxide layers which may tend to form on surface 57 to migrate from the inner heated area 92 radially outwardly from the center of the molten pool 55 to the outer heated area 93, thereby leaving the inner heated area 92 free of oxide layer at the surface 57 and thereby permitting evaporation of both elements from the second material 30 and the refractory element from the first material 20 (see FIG. 4).

Other heating patterns to accomplish the transient heating of an inner heated area 92 over an outer heated area 93 will immediately occur to persons skilled in the art. The invention is not limited to the particular circular heating patterns disclosed herein and in particular the circular heating pattern shown in FIGS. 2 & 3.

Apparatus 10 may also comprise a replenishment means for replenishing any minor amounts of material that are lost during the process of evaporation. Other additional elements may also be incorporated into apparatus 10 by those of ordinary skill to facilitate the practice of the method of this invention such as automated controls for the feed of replenishment means and second material, deposition rate sensors for incorporation into feedback controllers, means for modifying the vapor stream 70 such as by addition of various electrical potentials and other elements. Further, other elements or compounds may also be introduced back into housing enclosure 12 in order to react with one or more of the elements present in vapor stream 70 or condensate 50. Such elements or compounds could include oxygen, nitrogen, methane or other reactive species in the case of the evaporation of metal alloys.

The present invention will be described in further details with reference to the following non-limitative examples. In each of examples 1–17 set out below, a circular sample of second material 20 in the form of a 1" diameter Ni—Al alloy of composition as hereinafter described was used. A two-circle electron beam heating pattern, as shown in FIG. 3, was used to heat the material placed in the crucible, for examples 15 and 16. In all other examples a single circle electron beam pattern of 1" diameter heated area was used, using the same power as the two-circle heating pattern. In all cases single electron beam 68 provided a single beam of ¼" diameter, of approximately 30 kV at 0.67–1.0 amps, (i.e., 20–30 kW) which was directed at the rare earth metal "hot top". The hot top was heated to incandescence and caused to melt. For the two-circle heating method, the beam 68 was directed within the inner circle ½" diameter inner heated area 92 for 400 milliseconds, and rotated about and within the inner heated area 92 (See FIG. 3) of area B $(¼")^2$ during a 12.5 millisecond period, thereby repeating $400/12.5=32$ times. Thereafter the beam was directed to the outer heated circular area 93, as shown in FIG. 3, of scanned area $B\times[(½")^2-(¼")^2]$ (see FIG. 3) for 200 milliseconds. The beam 68 was then directed around the outer heated area over a period of 12.5 milliseconds, and accordingly repeated $200/12.5=16$ times. The beam was then directed back to the inner circle area 92, and the process continually repeated.

Composition of the resulting substrate for each of examples 1–17 was determined by electron microprobe analysis, and is shown in Tables I & II below. In all cases the composition of the deposit on the base material was taken from a position vertically above the longitudinal axis of the cylindrical ingot placed within crucible means 45.

EXAMPLE 1

Three (3) 3.5 gram disks of substantially pure rare earth metal (zirconium) "hot top", each approximately 1 inch in diameter by approximately ¹⁄₁₆ inch thick which formed the first-material 20, were placed on top of so as to substantially cover a 1" diameter×6 inch length ingot which formed the second material 30. Such ingot was comprised of nickel 50%-aluminum 50% (all amounts in atomic weight percent). A base material 50 was disposed directly above the "hot top" so as to provide a surface for any vapors to condense on.

An electron beam of 20 kV at 0.67–1.0 amps, (i.e., 20–30 kW) was directed at the rare earth metal "hot top", and the hot top heated to incandescence so as to cause it to melt. Upon melting, the rare earth metal "hot top" changed its shape from a disk to a sphere. The underlying second material ingot did not melt or form a melt pool. No zirconium was observed after such process on the surface of the base material 50 as determined by electron microprobe analysis.

EXAMPLE 2

Four 3.5 gram disks of substantially pure rare earth metal (zirconium) "hot top", each approximately 1 inch in diameter by approximately ¹⁄₁₆ inch thick, were placed on top of so as to substantially cover 1 inch diameter by approximately 6 inch in length ingot which formed the second material. Such ingot was comprised a nickel 50%-aluminum 50% (all amounts in atom percent). A base material was disposed directly above the "hot top" so as to provide a surface for vapors to condense on.

An electron beam of 25 kV at 0.67–1.0 amps, (i.e., 10–20 kW) was directed at the rare earth metal "hot top", and the hot top heated to incandescence so as to cause it to melt. Upon melting, the rare earth metal "hot top" changed its shape from a disk to a sphere. The underlying second material ingot did not melt or form a melt pool. No zirconium was definitively detected after such process on the surface of the base material as determined by electron microprobe analysis.

EXAMPLES 3–8

In each of examples 3 through 8, a first material "hot top" was formed, comprised of nickel 33%-aluminum 33%-zirconium 33% (all amounts in atom percent), with the weight (in grams) which were contained in the hot top (first material) shown in Table 1, below. The second material ingot comprised of nickel 50%-aluminum 50% (all amounts in atom percent). In each of these examples, the molten pool was heated by a single circle electron beam raster, scanning a 1" diameter area.

The hot top alloy was melted by the electron beam, and formed a continuous pool of zirconium-rich liquid, causing a substantial portion of the underlying nickel-aluminum ingot, which lay beneath such not-top to then melt. A raft of zirconium-rich liquid initially appeared on the top surface, and was distinguished by its bright white color compared to the characteristic orange color of the molten nickel-aluminum. This is believed to be due to zirconium having a higher emissivity than nickel-aluminum. During the course of several minutes (approximately 10–15 minutes), the white raft slowly disappeared, as the zirconium becomes completely mixed with the nickel-aluminum liquid from the feedstock ingot (second material). The concentration of zirconium found deposited on the base material were as set out in Table I below.

EXAMPLES 9–13

In each of these examples, save example 12 & 13 where the composition comprised Ni 18-Al 18 Zr 64, and Ni 12-Al-12 Zr 76, respectively, the first material comprised a nickel 33%-aluminum 33%-zirconium 33% (all amounts in atom percent) hot top. In Example 9, the second material was comprised of nickel 45%-aluminum 55% (all amounts in atom percent) ingot, whereas in Examples 10–13, the second material was comprised of nickel 50% -aluminum 50% -(all amounts in atom percent).

Composition of the resulting condensate on the substrate for each of Examples 9 through 13 was determined by electron microprobe analysis. The concentration of zirconium in the condensate is shown in Table I below.

concentrations were obtained in the coating 71 in concentrations in excess of 0.05 atomic percent. Likewise, with respect to Examples 16 & 17, where a two-circle rastering pattern was utilized, such produced greater concentrations of

TABLE I

| Exp. No. (Example No.) | Starting Material Composition (a/o) (i.e., second material) | Hot Top Composition (a/o)(i.e., first material) | Grams of refractory material (Zr) in Hot Top | Melt Pool Composition (a/o) | | | Substrate Composition (a/o) | | |
|---|---|---|---|---|---|---|---|---|---|
| | | | | Ni | Al | Zr | Ni | Al | Zr |
| E 161(1) | Ni50 - Al50 | 3 Zr disks | 10.5 | | | | 70.1 ± 0.5 | 26.8 ± 0.2 | 0.03 ± 0.04 |
| E 173(2) | Ni50 - Al50 | 4 Zr disks | 14.0 | | | | 59.3 ± 3.4 | 40.6 ± 2.3 | 0.03 ± 0.02 |
| E 189-2(3) | Ni50 - Al50 | Ni33 - Al33 - Zr33 | 13.0 | — | — | — | 61.7 ± 0.6 | 38.2 ± 0.6 | 0.10 ± 0.04 |
| E 189-4(4) | Ni50 - Al50 | Ni33 - Al33 - Zr33 | 13.0 | — | — | — | 63.4 ± 0.6 | 36.4 ± 0.9 | 0.16 ± 0.12 |
| E 196(5) | Ni50 - Al50 | Ni33 - Al33 - Zr33 | 14.0 | — | — | — | 62.9 ± 0.8 | 39.0 ± 1.8 | 0.02 ± 0.02 |
| E 290-1(6) | Ni50 - Al50 | Ni33 - Al33 - Zr33 | 15.2 | — | — | — | 52.4 ± 2.4 | 40.0 ± 3.0 | 0.02 ± 0.04 |
| E 291-1(7) | Ni50 - Al50 | Ni33 - Al33 - Zr33 | 15.2 | — | — | — | 48.3 ± 3.2 | 39.7 ± 1.9 | 0.01 ± 0.01 |
| E 289-2(8) | Ni50 - Al50 | Ni33 - Al33 - Zr33 | 15.2 | — | — | — | 52.0 ± 1.1 | 39.8 ± 1.5 | 0.02 ± 0.09 |
| E 286(9) | Ni45 - Al55 | Ni33 - Al33 - Zr33 | 15.5 | — | — | — | 61.0 ± 6.6 | 38.8 ± 6.8 | 0.06 ± 0.09 |
| E 181-10(10) | Ni50 - Al50 | Ni33 - Al33 - Zr33 | 25.7 | 22.3 | 3.3 | 73.3 | 60.7 ± 2.8 | 33.3 ± 2.0 | 5.01 ± 1.03 |
| E 255-5(11) | Ni50 - Al50 | Ni33 - Al33 - Zr33 | 32.5 | 16.7 | 3.7 | 78.7 | 57.4 ± 0.9 | 39.5 ± 2.1 | 2.46 ± 1.47 |
| E 180-8(12) | Ni50 - Al50 | Ni18 - Al18 - Zr64 | 41.3 | 16.0 | 2.6 | 81.2 | 59.8 ± 3.9 | 35.3 ± 4.6 | 4.36 ± 1.77 |
| E179-10(13) | Ni50 - Al50 | Ni12 - Al12 - Zr76 | 46.6 | 30.6 | 4.7 | 64.6 | 57.2 ± 4.9 | 38.5 ± 6.3 | 3.81 ± 4.71 |

TABLE II

| Exp. No. (Example No.) | Starting Material Composition (a/o) (i.e., second material) | Hot Top Composition (a/o(i.e., first material) | Grams of refractory material (Zr) in Hot Top | Electron Beam Pattern | Substrate Composition (a/o) Zr |
|---|---|---|---|---|---|
| E 379(14) | Ni50 - Al50 | Ni33 - Al33-Zr33 | 15.32 | 1 circle | 0.01–0.02 |
| E 380(15) | Ni50 - Al50 | Ni33 - Al33-Zr33 | 15.52 | 1 circle | 0.01–0.02 |
| E 381(16) | Ni50 - Al50 | Ni33 - Al33-Zr33 | 15.37 | 2 circle | 0.20–0.25 |
| E 387(17) | Ni49 - Al49-Cr2 | Ni33 - Al33-Zr33 | 15.57 | 2 circle | 0.30–0.72 |

EXAMPLES 14–15

Examples 14 & 15 utilized a 1 circle electron beam raster, like examples 1–13, with a first material having a Ni33-Al33-Zr33 composition (a/o), and the second material a Ni50-Al50 composition. Obtained substrate composition is shown in Table II.

EXAMPLES 16–17

In examples 16–17, the molten pool was heated by a two circle electron beam raster, as described previously the electron system which drove these two electron beam patterns switched continues from the inner circle to the outer circle, then returning to the inner circle, and repeating this pattern.

As may be seen from examples 10–13, where sufficient zirconium was present in the first material 20, zirconium zirconium in the coating 71 than for examples where equivalent amounts of zirconium were used, but only a single circle raster pattern was used (e.g. compare with examples 5–8).

It will be understood, of course, that modifications can be made in the embodiments of the invention described herein without departing from the scope and purview of the invention. For a complete definition as to the scope of the invention, reference is to be made to the appended claims.

We claim:

1. A method of vapor-depositing a coating on a base material (50), said coating comprising at least two metallic elements and a refractory element, wherein said refractory element comprises greater than 0.05 atomic percent of said vapor-deposited coating, the method comprising the steps of:

a) providing a source material, said source material comprising a first material (20), said first material comprising said at least two metallic elements, said refractory element being alloyed therewith, and a second material, said second material (30) comprising said at least two metallic elements;

b) placing said source material in a crucible (45) such that said first material is positioned over said second material and at least partially covers said second material;

c) providing a base (50) upon which said vapor-deposited coating is to be deposited;

d) positioning said base vertically above an opening in the crucible (45); and e) heating said first material (20), thereby creating a molten zone (55) in said first material (20), wherein said molten zone contacts said second material (30), thereby creating a second molten zone (56) within said second material (30), wherein said metallic two elements in said second material (30) are transported through said molten zone (55), wherein said refractory element and said two metallic elements in said second material (30) are evaporated from said source material and are condensed upon said base material (50), thereby forming said vapor-deposited coating (71).

2. The method of claim 1, wherein the step of providing a source material further includes selecting a refractory element from the group consisting of zirconium, hafnium, yttrium, titanium, rhenium, silicon, chromium, and alloys thereof.

3. The method of claim 1, wherein the step of beating said first material further including the step of heating an inner area (91) and an outer area (92) of said source material such that said inner area (91) is heated to a greater temperature than a temperature of said outer area (92).

4. A method of vapor-depositing (71) a coating on a base material (50), said coating comprising at least two metallic elements and a refractory element, wherein said refractory material comprises greater than 0.05 atomic percent of said vapor-deposited coating, the method comprising the steps of:

a) selecting a vapor-deposition source material, wherein said vapor deposition source material comprises a first material (20), said first material comprising a refractory element, said refractory element being alloyed with at least two metallic elements, and a second material (30) comprising said at least two metallic elements to be evaporated to form a vapor-deposited material, wherein said two metallic elements in said second material (30) that are to be evaporated are the same as said two metallic elements contained in said first material (20);

b) placing said vapor-deposition source material in a crucible (45) such that said first material (20) is positioned over said second material (30) and at least partially covers said second material (30);

c) providing a base (50) upon which said vapor-deposited coating (71) is to be deposited;

d) positioning said base (50) vertically above an opening in the crucible (45); and e) heating said first material (20), thereby creating a molten zone (55) in said first material (20), wherein said molten zone (55) contacts said second material (30), thereby creating a second molten zone (55) within said second material (30), wherein said two metallic elements in said second material (30) are transported through said molten zone (55), wherein said refractory element and said two metallic elements in said second material (30) are evaporated from said source material and are condensed upon said base material (50), thereby forming said vapor-deposited coating (71).

5. The method of claim 4, wherein the step of providing a source material further includes selecting a refractory element from the group consisting of zirconium, hafnium, yttrium, titanium, rhenium, silicon, chromium, and alloys thereof.

6. The method of claim 4, wherein the step of heating said first material (20) further including the step of heating an inner area (91) and an outer area (92) of said source material such that said inner area (91) is heated to a greater temperature than a temperature of said outer area (92).

* * * * *